United States Patent [19]
Curd

[11] Patent Number: 5,561,631

[45] Date of Patent: Oct. 1, 1996

[54] HIGH-SPEED MINIMAL LOGIC SELF BLANK CHECKING METHOD FOR PROGRAMMABLE LOGIC DEVICE

[75] Inventor: Derek R. Curd, San Jose, Calif.

[73] Assignee: Xilinx, Inc., San Jose, Calif.

[21] Appl. No.: 397,821

[22] Filed: Mar. 3, 1995

[51] Int. Cl.[6] .................................................. G11C 16/02
[52] U.S. Cl. .................... 365/185.22; 365/185.29
[58] Field of Search ................... 365/185.22, 185.29, 365/185.33, 218, 201, 189.08

[56] References Cited

U.S. PATENT DOCUMENTS

| | | | |
|---|---|---|---|
| 4,774,421 | 9/1988 | Hartmann | 365/185.22 |
| 5,347,490 | 9/1994 | Terada | 365/185.33 |
| 5,386,388 | 1/1995 | Atwood | 365/185.22 |
| 5,400,287 | 3/1995 | Fuchigami | 365/185.33 |

*Primary Examiner*—Tan T. Nguyen
*Assistant Examiner*—Son Mai
*Attorney, Agent, or Firm*—Michael A. Glenn; Jeanette S. Harms

[57] ABSTRACT

A programmable logic device (PLD) performs a self-test erase check operation on memory elements to verify if the PLD is completely erased. The output signals of the sense amplifiers associated with the PLD bitlines drive a plurality of NMOS devices. The NMOS devices share a common source (node), thereby providing in effect an n-input NOR gate, where n is the number of bitlines in the array. The memory cells associated with an entire wordline of the PLD memory array are simultaneously checked for an erased state by bringing the wordline under test high while keeping all other wordlines low. If all of the memory cells on a wordline are erased, every sense amplifier output is low, all of the NMOS devices are off, and the output signal of the NOR gate is high due to a weak pull-up on the common node, thereby indicating that the whole column is properly erased. If one or more memory cells on the selected wordline are not completely erased, then at least one sense amplifier output is high because the cell is not able to pull its bitline low to switch the sense amplifier. The high output of the sense amplifier turns on its associated NMOS device, thereby pulling down the voltage on the common node and providing a low output signal from the NOR gate, thereby indicating that additional erasing of the array is necessary.

20 Claims, 3 Drawing Sheets

HIGH-SPEED MINIMAL LOGIC SELF BLANK CHECKING METHOD FOR PROGRAMMABLE LOGIC DEVICE

BACKGROUND OF THE INVENTION

1. Technical Field

The present invention relates to programmable logic devices, and more particularly to a method for checking memory cell state in a programmable logic device.

2. Description of the Prior Art

Referring to FIG. 1, prior art programmable logic devices (PLDs) typically use one or more interconnect arrays 10 that are selectively programmed via an array of memory cells 12 (e.g. an EPROM, an EEPROM, a flash EPROM, or a flash EEPROM) to provide various interconnections within the PLD that are specific to a desired design. In interconnect array 10, the control gate of a memory cell 12 is connected to one column of the memory array (referred to as a wordline 14), typically driven by an input signal to array 10; the drain of memory cell 12 is connected to one row of the memory array (referred to as a bitline 16), typically a common output of signal array 10; and the source of memory cell 12 is tied to ground or virtual ground.

An erased memory cell which has a low threshold voltage Vt is turned on by a standard voltage source Vcc, thereby pulling down the voltage on bitline 16. Thus, an erased memory cell 12 constitutes a connection in the array. In contrast, a programmed memory cell which has a threshold voltage Vt above voltage source Vcc is not capable of affecting the state of its bitline. Thus, a programmed memory cell 12 does not constitute an array connection. Typically, a sense amplifier 18 is provided to sense and amplify the voltage of a bitline 16, which may only vary by tens of millivolts, to ensure full logic levels on the output lines of array 10.

Before a PLD is programmed with a new user design, the PLD is completely erased (i.e. all memory cells within the device are placed in an erased state). The PLD may be erased by exposing it to ultra-violet light (e.g. standard UV EPROMs), or may be erased electrically (e.g flash EPROMs and EEPROMs). With either method, a check is required to ensure that the erase cycle was successful in completely erasing the PLD.

PLDs may be programmed out-of-system, i.e. before the PLDs are installed into an electronic assembly. For PLDs that are programmed out-of-system in a programming socket, much of the burden of determining if the PLD is erased is placed on the software program that controls the programming of the PLD. Currently, there is a trend to program and erase the PLDs in-system, i.e. after installation into an electronic assembly. Such in-system programming and erasing places more of the burden for performing the erase check (also referred to as a blank check) procedure on the PLD itself because the software program that controls the programming of the PLD has only restricted access to the PLD once the PLD is installed in-system.

When PLDs are programmed out-of-system in a programming socket, the normal READ or VERIFY mode of the PLD is typically used to perform a blank check on the device. Thus, the programming software provides a row and column address to the address pins of the PLD which in turn corresponds to one or more locations in the PLD memory array. The state of each addressed memory cell is then read out on the PLD's data pins. The programming software generates addresses for every row/column location in the PLD memory array and verifies that the memory cell at each such location is in an erased or blank state. This procedure is performed entirely by the programming software and is thus transparent to the user.

In-system programming and erase schemes typically limit the programming software to serial access to the PLD through a small number of the PLD's I/O pins, e.g. four or five pins. Because such serial access is slow, blank check schemes that require the software to generate all of the row/column memory addresses to verify that the PLD is entirely erased are less desirable. Thus, it is more desirable for the PLD to blank check itself without assistance from the programming software.

One known method of performing an in-system self-test is for the PLD to mimic those signals that the programming software would typically provide at the address pins of the device. Implementing this scheme requires providing on-chip address counters and control logic that is adapted to generate each individual row/column address for the PLD memory array and verify a blank result for each address location, thereby significantly increasing the amount of logic required to perform the blank check. Thus, this self test undesirably produces a larger, more complex device. Furthermore, for addressing schemes that are not necessarily sequential in nature, implementation of a self check scheme becomes even more complex because, while a sequential counter is easy to design, a counter that skips addresses requires more logic to indicate which addresses to skip. Accordingly, this approach is sometimes slower than a software driven blank check, and also produces a more complex PLD that has a larger die size.

Therefore, a need arises for a blank self test scheme for a PLD that does not rely upon external factors, such as programming software, and that does not burden the PLD with excessive circuitry.

SUMMARY OF THE INVENTION

The invention provides a self-test blank check for a PLD that requires minimal additional internal circuitry, while dramatically reducing the time required to perform a blank check test. The self-test method of the present invention simultaneously verifies that an entire column of a PLD memory array is blank, rather than verifying only one memory cell at a time. This approach eliminates the need to create row addresses within the PLD and therefore substantially reduces the number of counters and other logic required to address the memory array.

In one embodiment, the output signals of the sense amplifiers for the bitlines are adapted to drive a plurality of NMOS devices. The NMOS devices are driven by non-inverted output signals of the sense amplifiers. That is, if a signal on a bitline is low then, the sense amplifier outputs a low voltage signal, whereas if a signal on a bitline is high then the sense amplifier outputs a high voltage signal. All of the NMOS devices share a common drain connection referred to as the common node. A PMOS device, which also has its drain connected to the common node, has its gate permanently grounded so that it acts as a weak pull-up on the common node. Thus, the PMOS devices and the plurality of NMOS devices are configured to effectively provide a large NMOS n-input NOR gate, wherein n is the number of bitlines, or rows, in the array.

In the present invention, all of the memory cells associated with an entire wordline, or column, of the PLD memory array are simultaneously checked for an erased state by selecting a wordline, i.e. providing a high voltage on the selected wordline while keeping the voltage on all other wordlines low. All erased memory cells driven by the one high wordline respond by pulling their associated bitlines low, which in turn sets the sense amplifiers to a low output state.

If all of the memory cells on a wordline are erased, every sense amplifier output signal is low, thereby turning off all of the NMOS devices. Because the common node is pulled high by the PMOS device, the output signal of the NOR gate is high, thereby indicating that the whole column is properly erased (blank).

If one or more memory cells on the selected wordline are not completely erased, then at least one sense amplifier output signal is high because the non-erased memory cell is not able to pull its bitline low to set the sense amplifier. The high output signal of the sense amplifier turns on its associated NMOS device, thereby pulling the voltage on the common node low. This low signal indicates that at least one memory cell on that wordline is not fully erased.

Each wordline is selected in turn, to verify whether the associated memory cells on that wordline are blank. If at any time during the self-test blank check the common node is low, there is an immediate indication that the array is not completely erased, and that additional erasing is therefore required.

DETAILED DESCRIPTION OF THE DRAWINGS

The invention provides a self-test blank check for a PLD that requires minimal additional internal circuitry, while dramatically reducing the time required to perform a blank check test. The self-test scheme herein described simultaneously verifies that an entire column of a PLD memory array is blank, rather than verifying only a small number of memory cells at a time. This approach eliminates the need to create row addresses within the PLD, thereby substantially reducing the number of counters and other logic required to address the memory array.

Figure 1:
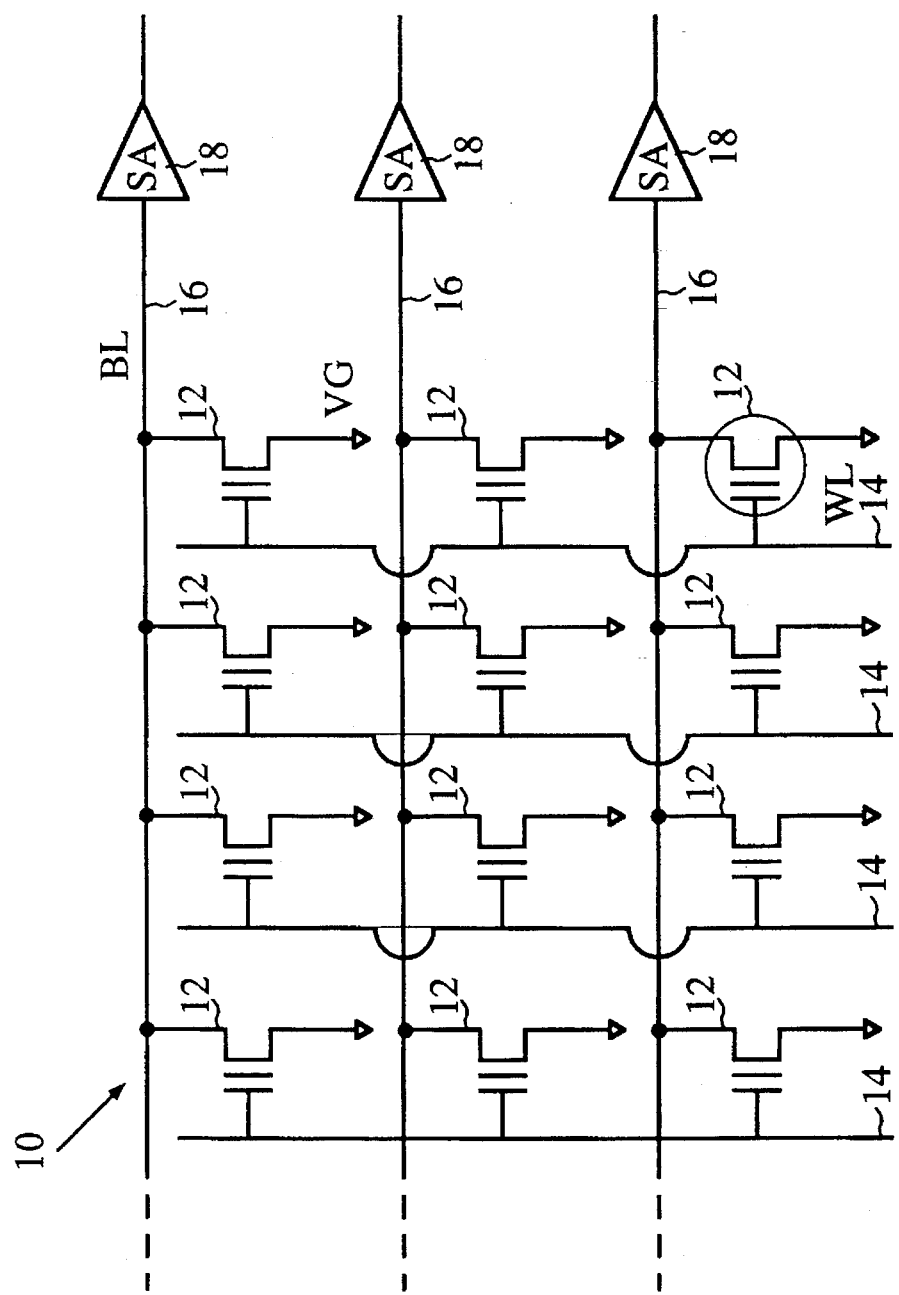
FIG. 1 is a block schematic diagram showing an interconnect array and sense amplifiers for a prior art programmable logic device.
Figure 2:
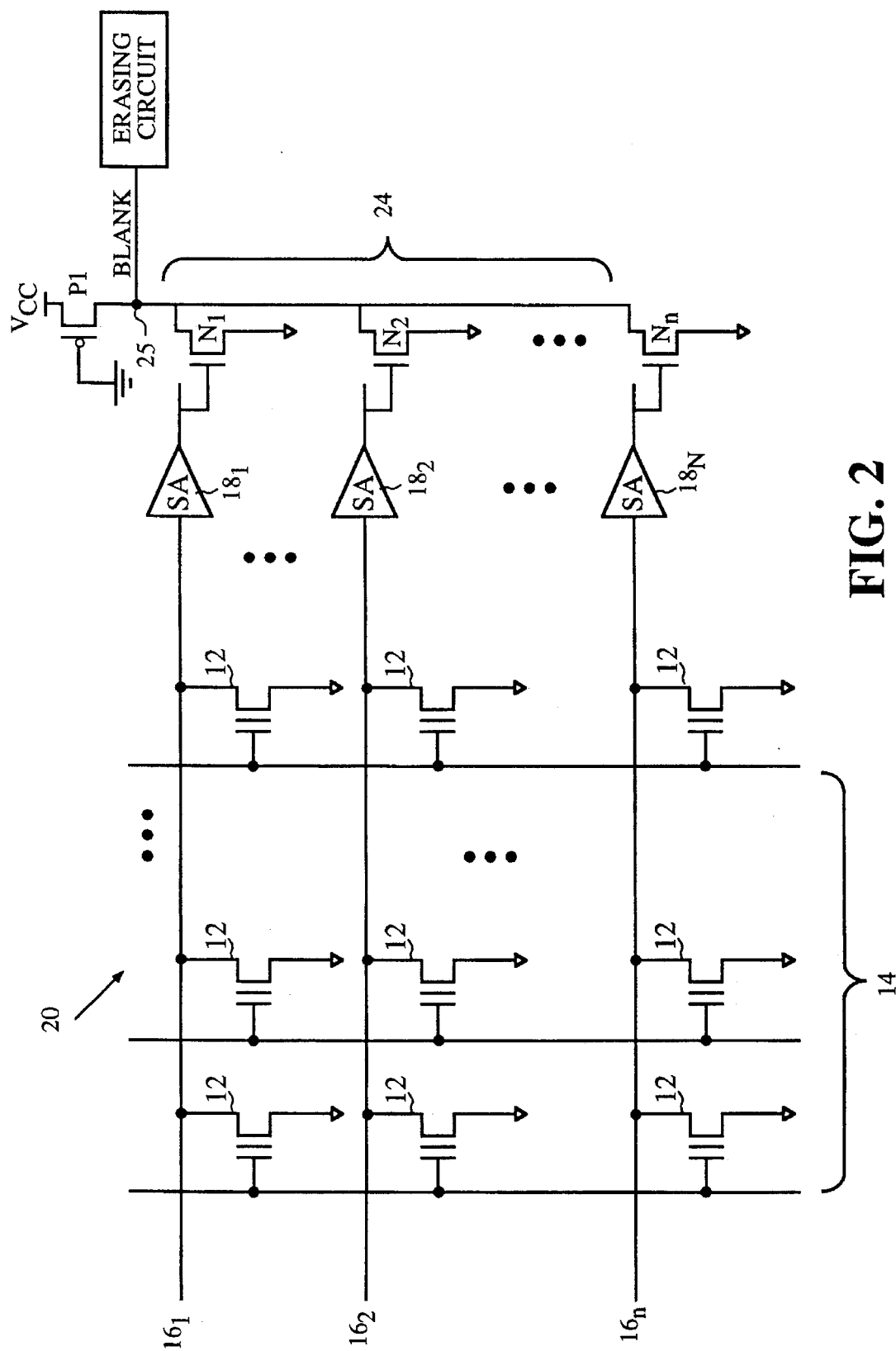
FIG. 2 is a block schematic diagram showing an interconnect array and sense amplifiers for a programmable logic device in which a self-blank checking scheme is implemented according to the invention.

FIG. 2 is a block schematic diagram showing an interconnect array and sense amplifiers for a programmable logic device in which a self-test check is implemented according to the invention. As shown in FIG. 2, the output signal of sense amplifiers $18_1$–$18_n$ for bitlines $16_1$–$16_n$ drives the gate of NMOS devices N1–Nn, respectively. Thus, the voltage on the gate is low if the signal on bitline 16 is low, and the voltage on the gate is high if the signal on bitline 16 is high. All NMOS devices N1–Nn share a common drain connection, referred to as common node 25.

A PMOS device P1, which also has its drain connected to common node 25, has a gate that is permanently connected to ground thereby turning on device P1. Because device P1 has a relatively large length to width ratio, device P1 provides a weak pull-up on common node 25. In this configuration, pull-up device P1 and pull-down devices N1–Nn comprise an n-input NOR gate 24, where n is the number of bitlines 16 in memory array 20.

The invention provides a scheme that allows a simultaneous blank check of all memory cells associated with a wordline 14 of memory array 20. Such checking is accomplished by bringing the wordline 14 under test to a high voltage while keeping all other wordlines at a low voltage using an internal self-test routine, or by other known addressing schemes.

All erased memory cells driven by the high voltage on the selected wordline respond by pulling their associated bitlines 16 low, which in turn causes sense amplifiers 18 associated with bitlines 16 to produce a low output state. If all memory cells 12 on a wordline 14 are erased, every sense amplifier output is a low signal, and devices N1–Nn remain off. In this manner, common node 25 is pulled high by device P1. Thus, a high output signal indicates that the whole column of selected memory cells 12 is properly erased. This signal may be monitored internally by a self-test routine or by other known means (described in detail in reference to FIG. 3).

If one or more memory cells 12 on the selected wordline 14 are not completely erased, then at least one sense amplifier 18 produces a high output signal because an unerased memory cell is not able to pull its bitline low to trip its associated sense amplifier. The high output signal of the sense amplifier turns on its associated NMOS device, thereby pulling common node 25 low. Thus, a low output signal indicates that at least one memory cell 12 on the selected wordline 14 is not fully erased.

Each wordline 14 is brought high in turn, with all of the other wordlines held low, to verify whether each column of memory cells 12 in memory array 20 is blank. In one embodiment, this portion of the self test is performed with static conditions on wordlines 14, thereby eliminating potentially unreliable results by performing a self test while switching between wordlines 14.

Because all memory cells 12 in memory array 20 are typically erased simultaneously, it is not necessary that common node 25 indicate exactly which memory cell or how many memory cells are not erased. Specifically, if the signal on common node 25 is low, the self-check procedure is terminated and another erase cycle is implemented. Thus, the self-check procedure of the present invention is run repeatedly until every column of memory cells 12 is verified as being fully erased. If a predetermined number of erase cycles does not produce a blank PLD, then the PLD is typically discarded as defective. If all wordlines 14 associated with memory array 20 are checked, and the signal on common node 25 does not go low, then the blank check is successful and the PLD is ready for re-programming by the user.

Because the check method of the present invention addresses only columns (i.e. wordlines 14) of memory array 20, no logic is required to address individual rows (i.e. bitlines 16) of the array. In this manner, the amount of logic, for example address counters and control logic, needed to address memory array 20 is significantly reduced by as much as fifty percent, depending on the dimensions of memory array 20. Moreover, the time required to perform a complete blank check of the PLD is dramatically reduced by the present invention because an entire column of memory array 20 is checked simultaneously, rather than checking each memory cell 12 individually (or checking a small number of memory cells 12 simultaneously). Currently, PLD memory arrays have between 70–288 columns and between 90–100 rows. Thus, by simultaneously checking the memory cells of an entire column, the present invention reduces the amount of time required to perform a blank check by a factor of ten or more.

Figure 3:
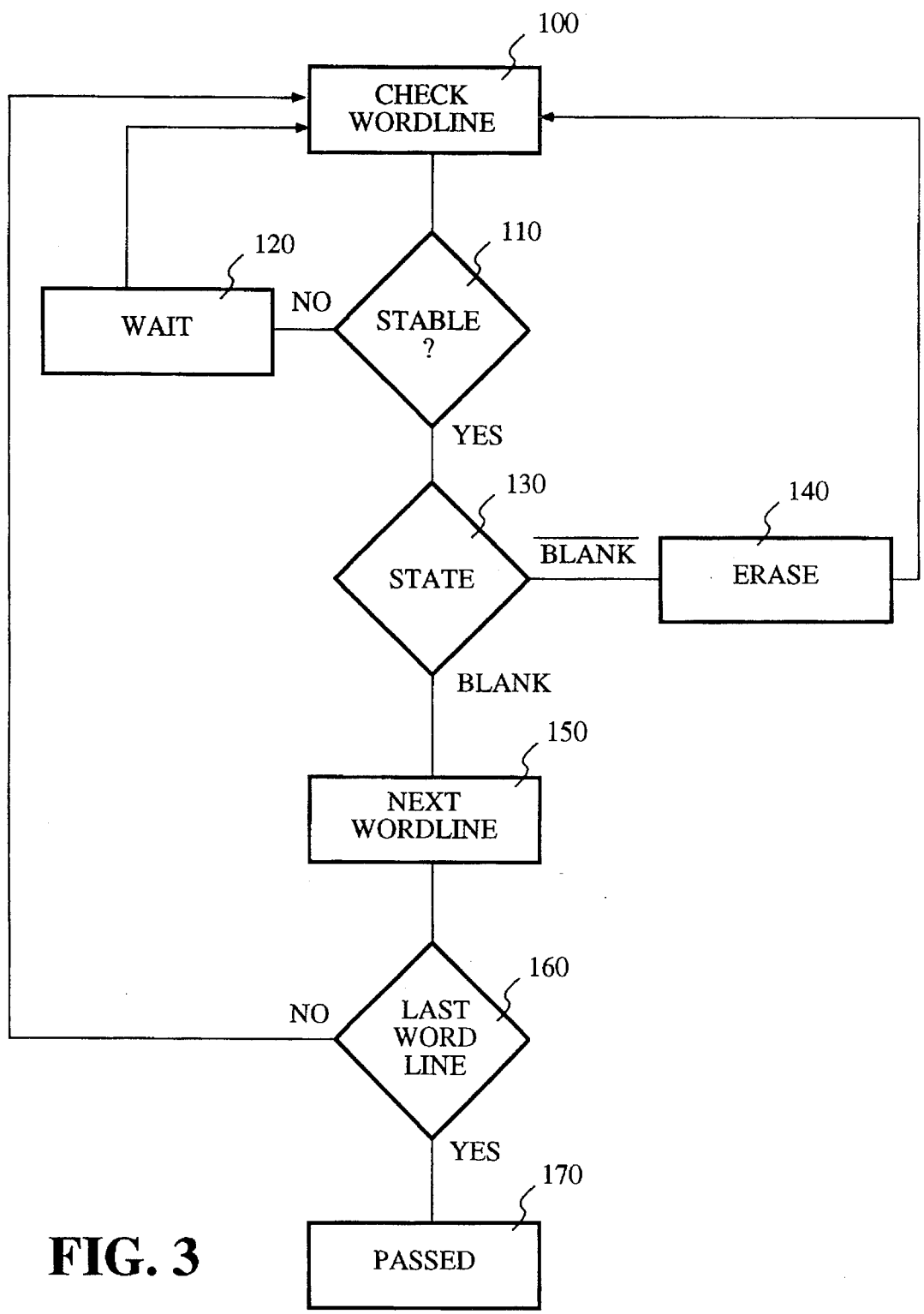
FIG. 3 is a flow diagram showing the self-blank checking scheme according to the invention.

FIG. 3 illustrates a flow diagram of the self-blank checking scheme according to the present invention. After a wordline is addressed in step 100, the system waits in step 120 until the wordline is stable as verified in step 120. Once the wordline is stable such that an accurate blank check can be performed, the system checks the state of the common node in step 130 (for example, common node 25 shown and described above in FIG. 2). If the signal on the common node indicates at least one of the memory cells associated with the wordline is not erased, e.g. a BLANK signal, then the PLD memory array is erased in step 140, and the blank check begins again in step 100. If the signal on the common node indicates all the memory cells associated with the wordline are erased, e.g. a BLANK signal, then the next wordline of the PLD memory array is selected in step 150. When the last wordline is tested in step 160 and all of memory cells are found to be erased, the PLD is "passed" in step 170, thereby indicating that the PLD is erased (blank) and ready to be programmed or reprogrammed.

Although the invention is described herein with reference to the preferred embodiment, one skilled in the art will readily appreciate that other applications may be substituted for those set forth herein without departing from the spirit and scope of the present invention. For example, in other embodiments of the present invention, a low voltage signal is used to read a memory cell. As another example, while the embodiment disclosed herein teaches the use of NMOS devices, those skilled in the art will recognize that other embodiments including PMOS devices, CMOS devices, and bipolar devices are variations of the present invention. Accordingly, the invention should only be limited by the claims included below.

We claim:

1. An apparatus for verifying the erasure of a column of memory cells in a programmable logic device (PLD), each memory cell in said column having one terminal coupled to a common voltage source, a second terminal coupled to an associated bitline and an associated sense amplifier, and a control terminal coupled to a common wordline, said apparatus comprising:

an n-input gate, wherein each input terminal of said n-input gate is coupled to an output terminal of one of said associated sense amplifiers, wherein said n-input gate determines the state of said column of memory cells when said wordline is addressed and provides an output signal in accordance therewith; and means for erasing said column of memory cells, wherein said means for erasing receives said output signal and is operatively coupled to said column of memory cells.

2. The apparatus of claim 1, wherein if said output signal has a first logic state, then said column is erased; and wherein if said output signal has a second logic state, then at least one memory cell in said column is not completely erased.

3. The apparatus of claim 1, wherein if one wordline is addressed, then all other wordlines are unaddressed.

4. The apparatus of claim 1, said n-input gate further comprising:

a plurality of NMOS devices, each NMOS device receiving a signal from one of said associated sense amplifiers, wherein a low voltage signal is provided by said sense amplifier if said bitline is in a low state, and wherein a high voltage signal is provided by said sense amplifier if said bitline is in a high state; wherein said plurality of NMOS devices share a common output node.

5. The apparatus of claim 4, said gate further comprising:

a PMOS device, connected to said output common node, having a gate that is permanently grounded, said PMOS device providing a weak pull-up on said output node.

6. An apparatus for verifying the erasure of a column of memory cells in a programmable logic device (PLD), each memory cell in said column having one terminal coupled to a common voltage source, a second terminal coupled to an associated bitline and an associated sense amplifier, and a control terminal coupled to a common wordline, said apparatus comprising:

an n-input gate comprised of a plurality of devices, all of said devices sharing a common node, wherein each of said devices is coupled to an output terminal of one of said associated sense amplifiers, wherein said n-input gate simultaneously checks all memory cells in said column for an erased state when said wordline is addressed, and produces an output signal in accordance therewith; and means for erasing said column of memory cells, wherein said means for erasing receives said output signal and is operatively coupled to said column of memory cell.

7. The apparatus of claim 6, wherein if said output signal has a first logic state, then said column is erased; and if said output Signal has a second logic state, then at least one memory cell in said column is not fully erased.

8. The apparatus of claim 6, wherein said devices may be any of NMOS, PMOS, and bipolar devices.

9. The apparatus of claim 6, wherein said associated sense amplifier amplifies the non-inverted signal on said associated bitline.

10. The apparatus of claim 6, wherein said PLD includes a plurality of columns of memory cells, wherein each column of memory cells has an associated wordline, wherein if one wordline is addressed, then all other wordlines are unaddressed.

11. The apparatus of claim 6, said n-gate further comprising:

a pull-up device having a gate that is connected to said common node, said pull-up device providing a weak pull-up on said common node.

12. A method for verifying the erasure of a column of memory cells in a programmable logic device (PLD), each memory cell in said column having one terminal coupled to a common voltage source, a second terminal coupled to an associated bitline and an associated sense amplifier, and a control terminal coupled to a common wordline, said method comprising the step of:

using an n-input gate to simultaneously check all memory cells in said column for an erased state when said wordline is addressed, wherein said n-input gate provides an output signal on an output node in accordance therewith.

13. The method of claim 12, wherein if said output signal has a first logic state, then said column of memory cells is erased; and wherein if said output signal has a second logic state, then at least one memory cell in said column is not fully erased.

14. The method of claim 12, wherein said PLD includes a plurality of columns of memory cells, each column including an associated wordline, and wherein if one wordline is addressed, then all other wordlines are unaddressed.

15. The method of claim 12, further comprising the steps of:

providing a low signal to said n-input gate if said associated bitline has a low state; and providing a high signal to said n-input gate if said associated bitline has a high state.

16. The method of claim 12, further comprising the step of:

providing a weak pull-up on said output node.

17. A method for verifying the erasure of a column of memory cells in a programmable logic device (PLD), each memory cell in said column having one terminal coupled to a common voltage source, a second terminal coupled to an associated bitline and an associated sense amplifier, and a control terminal coupled to a common wordline, said method comprising the step of:

simultaneously checking the state of said column of memory cells when said common wordline is addressed using an n-input gate comprised of a plurality of devices, all of said devices sharing a common output node, wherein each of said devices receives a control signal from one of said associated sense amplifiers; and producing an output signal in accordance therewith.

18. The method of claim 17, further comprising the steps of:

providing a signal of a first logic state if said column is erased; and providing a signal of a second logic state if at least one memory cell in said column is not fully erased.

19. The method of claim 17, further comprising the steps of:

outputting a low voltage signal from said associated sense amplifier if said associated bitline is in a low state; and outputting a high voltage signal from said associated sense amplifier if said associated bitline is in a high state.

20. The method of claim 17, further comprising the step of:

addressing each wordline in turn, with all other wordlines unaddressed, to verify whether an entire PLD memory array is erased.

* * * * *